US010082419B1

(12) United States Patent
Eckert et al.

(10) Patent No.: US 10,082,419 B1
(45) Date of Patent: *Sep. 25, 2018

(54) ADJUSTABLE LOAD TRANSMITTER

(71) Applicant: International Business Machines Corporation, Armonk, NY (US)

(72) Inventors: Martin Eckert, Moetzingen (DE); Siegfried Tomaschko, Neustadt (DE); Roland Dieterle, Holzgerlingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/858,324

(22) Filed: Dec. 29, 2017

Related U.S. Application Data

(63) Continuation of application No. 15/649,809, filed on Jul. 14, 2017.

(51) Int. Cl.
*G01R 31/00* (2006.01)
*G01G 3/14* (2006.01)
*G03F 9/00* (2006.01)

(52) U.S. Cl.
CPC .......... *G01G 3/1414* (2013.01); *G03F 9/703* (2013.01); *G03F 9/7015* (2013.01)

(58) Field of Classification Search
CPC . G03F 9/76015; G03F 9/703; G01R 31/2891; G01R 3/00; G01R 1/07314
See application file for complete search history.

(56) References Cited

U.S. PATENT DOCUMENTS

| | | | |
|---|---|---|---|
| 6,586,956 B2 | 7/2003 | Aldaz et al. |
| 7,071,715 B2 | 7/2006 | Shinde et al. |
| 7,119,566 B2 | 10/2006 | Kim |
| 9,322,843 B1 | 4/2016 | Tsironis |
| 2005/0127927 A1 | 6/2005 | Harris et al. |
| 2006/0244470 A1 | 11/2006 | Shinde et al. |
| 2007/0126435 A1 | 6/2007 | Eldridge et al. |
| 2013/0174665 A1 | 7/2013 | Silva |

(Continued)

FOREIGN PATENT DOCUMENTS

GB 2309734 A * 8/1997 ................ F16C 7/06
WO 2011062312 A1 5/2011

OTHER PUBLICATIONS

Eckert et al., "Adjustable Load Transmitter", U.S. Appl. No. 15/649,809, filed Jul. 14, 2017.

(Continued)

*Primary Examiner* — Jermele M Hollington
(74) *Attorney, Agent, or Firm* — Stosch Sabo

(57) ABSTRACT

The disclosure relates to an adjustable load transmitter for adjusting an alignment between planar members separated from each other by a gap. The load transmitter comprises a set of plates to be received inside the gap, the set comprising two rotatable plates and being adapted for transmitting a load via a load transmission path between the planar members. The load transmission path comprises the rotatable plates. Each of the plates comprises two flat, non-parallel contact faces, and one of the contact faces of the first rotatable plate is in permanent surface contact with one of the contact faces of the second rotatable plate. The rotatable plates are adapted for being rotated relative to each other around one of their respective normal axes.

1 Claim, 7 Drawing Sheets

(56) References Cited

U.S. PATENT DOCUMENTS

| | | |
|---|---|---|
| 2013/0241587 A1 | 9/2013 | Chua et al. |
| 2016/0342636 A1 | 11/2016 | Braghin et al. |
| 2016/0377655 A1 | 12/2016 | Liberini et al. |
| 2017/0108534 A1 | 4/2017 | Appinger et al. |
| 2017/0108547 A1 | 4/2017 | Appinger et al. |
| 2017/0139003 A1 | 5/2017 | Dengler et al. |

OTHER PUBLICATIONS

Eckert et al., "Adjustable Load Transmitter", U.S. Appl. No. 15/795,313, filed Oct. 27, 2017.
Eckert et al., "Probe Card Alignment", U.S. Appl. No. 15/649,762, filed Jul. 14, 2017.
Eckert et al., "Probe Card Alignment", U.S. Appl. No. 15/795,307, filed Oct. 27, 2017.
Eckert et al., "Probe Card Alignment", U.S. Appl. No. 15/858,177, filed Dec. 29, 2017.
Eckert et al., "Wafer Probe Alignment", U.S. Appl. No. 14/887,510, filed Oct. 20, 2015.
Eckert et al., "Wafer Probe Alignment", U.S. Appl. No. 15/176,681, filed Jun. 8, 2016.
List of IBM Patents or Patent Applications Treated as Related. Filed Jan. 4, 2018. 2 pages.

\* cited by examiner

ADJUSTABLE LOAD TRANSMITTER

This application is a continuation of U.S. application Ser. No. 15/649,809, filed on Jul. 14, 2017, the entire contents of all are incorporated herein by reference.

BACKGROUND

The present disclosure relates to an adjustable load transmitter, and more specifically, to an adjustable load transmitter adapted for providing mechanical support between two loadable members.

Two basically planar members are to be loaded with an external force. Adjusting the two planar members to a suitable, e.g. parallel, alignment is subject to dimensional tolerances of the members. The members may feature a local surface structure and/or a large-scale misalignment which prevents a precise relative alignment of the two planar members to be loaded.

An external force would cause the planar members to move relative to each other, such that a gap separating them will get closed. When the planar members come into physical contact with each other, they may move away from the prepared relative orientation and/or may become unable to assume a desired relative orientation for the case that the full load is applied.

SUMMARY

It is an objective of the present disclosure to provide for an adjustable load transmitter and a method deploying said adjustable load transmitter for adjusting an alignment between a first planar member and a second planar member. Embodiments of the disclosure are given in the dependent claims. Embodiments of the present disclosure can be freely combined with each other if they are not mutually exclusive.

In one aspect, the present disclosure provides for an adjustable load transmitter for adjusting an alignment between a first planar member and a second planar member. The planar members can be separated from each other by a gap. The load transmitter can comprise a set of plates adapted to be received inside the gap. The set can comprise a first rotatable plate and a second rotatable plate. The set can be adapted for transmitting a load via a load transmission path between the planar members. The load transmission path can comprise the first rotatable plate and the second rotatable plate. Each of the plates can comprise two flat contact faces. The contact faces of the first rotatable plate can be non-parallel to each other, and the contact faces of the second rotatable plate can be non-parallel to each other. One of the contact faces of the first rotatable plate can be in permanent surface contact with one of the contact faces of the second rotatable plate. Each of the first rotatable plate and the second rotatable plate can be adapted for being rotated relative to each other around one of their respective normal axes.

In another aspect, the present disclosure provides for a method for adjusting an alignment between a first planar member and a second planar member, the planar members being separated from each other by a gap, the method comprising providing an adjustable load transmitter in the gap. The load transmitter can comprise a set of plates adapted to be received inside the gap. The set can comprise a first rotatable plate and a second rotatable plate. The set can be adapted for transmitting a load via a load transmission path between the planar members. The load transmission path can comprise the first rotatable plate and the second rotatable plate. Each of the plates can comprise two flat contact faces. The contact faces of the first rotatable plate can be non-parallel to each other. The contact faces of the second rotatable plate can be non-parallel to each other. One of the contact faces of the first rotatable plate can be in permanent surface contact with one of the contact faces of the second rotatable plate. Each of the first rotatable plate and the second rotatable plate can be adapted for being rotated relative to each other around one of their respective normal axes. The method can further comprise setting an angular alignment between the second planar member and the contact face of the set of plates facing the second planar member by rotating each of the rotatable plates about a pre-determined adjustment angle around its respective rotational axis. The adjustment angles can be determined such that two angles of inclination, defined in different non-parallel directions between the second planar member and the contact face of the set of plates facing the second planar member, assume each a pre-determined value. The method can further comprise establishing the load transmission path by closing a clearance between the second planar member and the contact face of the set of plates facing the second planar member.

In yet another aspect, the present disclosure provides for a load bearing system comprising a first planar member and a second planar member, the planar members being separated from each other by a gap. The load bearing system further comprising a load transmitter having a set of plates adapted to be received inside the gap. The set further having a first rotatable plate and a second rotatable plate. The set being adapted for transmitting a load via a load transmission path between the planar members. The load transmission path can include the first rotatable plate and the second rotatable plate, where each of the plates can comprise two flat contact faces such that the contact faces of the first rotatable plate are non-parallel to each other, and the contact faces of the second rotatable plate are non-parallel to each other. One of the contact faces of the first rotatable plate can be in permanent surface contact with one of the contact faces of the second rotatable plate. Each of the first rotatable plate and the second rotatable plate can be adapted for being rotated relative to each other around one of their respective normal axes. The load transmitter can be configured to establish the load transmission path between the planar members by closing the gap.

BRIEF DESCRIPTION OF THE DRAWINGS

In the following embodiments of the disclosure are explained in greater detail, by way of example only, making reference to the drawings.

DETAILED DESCRIPTION

Figure 1:
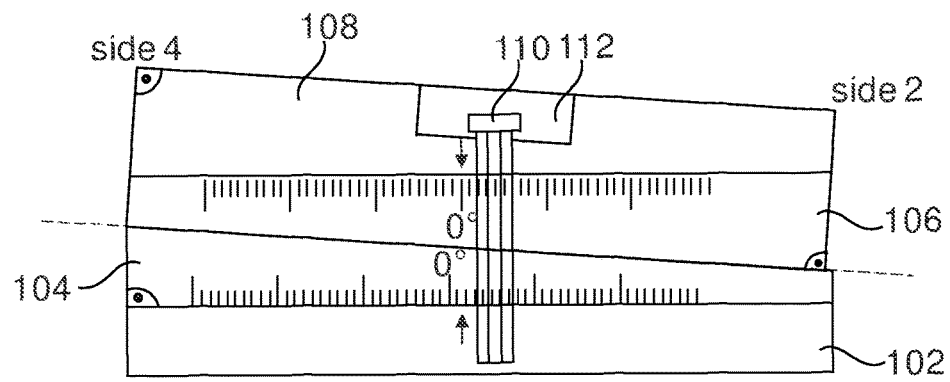
FIG. 1 is a schematic cut through a representative set of plates according to some embodiments of the present disclosure.

A load is to be transmitted between two planar members separated by a gap. The relative orientation between the two planar members shall be maintained with a high precision after exerting the planar members to the load.

In the following, embodiments of the present disclosure are discussed with reference to the Figs. It is understood that the embodiments discussed in the text and shown in the Figs. are only of illustrative nature. A person of ordinary skill in the art will naturally be able to combine, replace, extend, or otherwise vary the disclosed features without departing from the scope and spirit of the present disclosure.

Aspects of the present disclosure provide an adjustable load transmitter comprising a set of plates adapted to be received inside a gap separating a first planar member and a second planar member. For reasons of simplicity, the following description mainly refers to embodiments of the disclosure where the set of plates comprises a vertical arrangement or stack of the plates. Such vertical set of plates is adapted for being deployed in a vertical gap between the two planar members facing each other vertically. However, it will naturally occur to any person of ordinary skill in the art that the set of plates can be turned by 90° to convert the vertical arrangement of the plates into a horizontal one, such that the set of plates may likewise be deployed in a horizontal gap separating the two planar members facing each other in a horizontal arrangement. Embodiments of the disclosure comprise the set of plates in an arbitrary arrangement, where the set of plates is stabilized internally, e.g. by a bolt which is received by holes in the plates, as explained further below. Where applicable, descriptions involving a vertically arranged set of plates shall therefore not be construed as imposing a limitation on embodiments of the disclosure.

The adjustable load transmitter may provide a beneficial combination of high-precision adjustment and load transmission capability through a load transmission path with a large cross-sectional area. Embodiments of the disclosure may be advantageous compared to e.g. providing a solid plate in the gap, as they provide for adjusting the mechanical support to a desired orientation. Compared to solutions based on adjustment screws, embodiments of the present disclosure may avoid abrasion, such that the adjustability of the setup is maintained even after long times of repeated usage.

The set of plates comprises at least two rotatable plates which are directly contacting each other via one out of two flat contact faces. The plates should be made of any solid material which is incompressible under the load which is expected to be transmitted by the load transmitter during usage. According to some embodiments, the plates are made of metallic material. Metallic materials such as raw metals or metal alloys may provide for a very high load capacity and good machinability combined with a very low compressibility.

According to some embodiments, the plates are cylindrical segments. This may be achieved by machining the plates with a circular cross-section and have the advantage that a constant distance may be kept to horizontally neighboring objects which may hinder the rotation of the plates otherwise. Furthermore, circular plates are best suitable for adding an annular graduation to the perimeter of the rotatable plates.

The planes defining the cylindrical segments may be oriented perpendicularly to the primary axis of the cylinder, which yields a plane parallel plate with a rectangular cross-section, the cross-section being now oriented parallel to the primary axis. However, at least one of the cutting planes may be tilted against the primary axis with an angle between 0° and 90°. Preferably, each moveable plate of the set of plates comprises one flat contact face in a perpendicular orientation to a rotational or primary axis of the plate, and a further flat contact face being in a slanted orientation relative to this axis. This yields a four cornered cross-section parallel to the primary axis where two neighboring angles are right angles and the two remaining angles of said cross-section are not right angles. According to some embodiments, at least one of the rotatable plates has a right trapezoidal cross-section. This may simplify the machining process of the plates compared to cutting them with a slanted face on both sides, and it may also simplify the calculation of adjustment angles, as explained further below, by which the rotatable plates may be rotated in order to achieve a specified alignment of the adjustable load transmitter. If a cylindrical segment plate is implemented with a right trapezoidal cross-section, then one of its contact faces is circular and the other one is elliptical.

It may be beneficial to select the horizontal dimensions, or diameters, of the plates as large as possible, such that the set of plates just fits the horizontal dimensions of the gap without contacting a horizontally neighboring structure of the gap in any adjustment angle which may be selected for the rotational plates and/or for any other configuration of the set of plates which may be prepared using otherwise moveable plates as described further below.

Regardless of its composition and/or configuration, the set of plates shall be adapted for transmitting a load via a load transmission path between the planar members. This is achieved by the plates directly contacting and facing each other via their flat contact faces which are also adapted for contacting the planar members in the same way. The flat contact faces may provide a capability of transmitting the load between the two planar members through a laminar, full surface, or two-dimensional contact area for each interface between two neighboring plates or between one of the outer plates of the set of plates and the respective planar member they may be facing upon being installed in the gap. The load transmission path comprising a two-dimensional cross section along the whole of its length may be not prone for abrasion, while being highly configurable for providing or correcting an alignment between two planar members with a high alignment precision and resolution.

As mentioned above, the set of plates may comprise more plates than the two rotatable plates mentioned before. FIG. 1 shows a schematic section through a set of plates (e.g., set of plates 100, also referred to as an adjustable load transmitter 100 and/or a load transmitter 100 herein) comprising four plates, namely a base plate (e.g., base plate 102) shown at the bottom and being in permanent surface contact with a first rotatable plate (e.g., first rotatable plate 104), which is placed in permanent surface contact below a second rotatable plate (e.g., second rotatable plate 106), which in turn is in permanent surface contact below a slide plate (e.g., slide plate 108) forming the top of the stacked set of plates. The base plate is a plane parallel plate, while the two rotatable plates and the slide plate have a right trapezoidal cross-section. Each plate contains a hole (e.g., slot hole 112) located at a central position. The holes are aligned upon each other and receiving a bolt (e.g., bolt 110) with a screw head. The slide plate further comprises a long hole on its upper side which receives the screw head. The hole in the base plate is shown as a blind hole and the bottom of the bolt is contacting the bottom of the blind hole. Overlaid with the Fig. are one angle scale on each of the rotatable plates and one tick mark each on the base plate and the slide plate.

It is understood that embodiments of the disclosure are neither restricted to the setup comprising merely two rotatable plates, as described above, nor to the four plate design depicted in FIG. 1. It may rather be useful or beneficial to implement the set of plates with three plates or even more than four plates, as may be necessary for a particular usage scenario. However, embodiments should comprise at least the two rotatable plates in order to achieve full angular adjustability in at least two non-parallel directions. In this disclosure, the discussion of the Figs. will mainly focus on embodiments where the set of plates comprises four plates, for reasons of simplicity.

According to embodiments, the set further comprises a base plate, the load transmission path further comprising the base plate, the base plate comprising two flat contact faces, the contact faces of the base plate being parallel to each other, the first rotatable plate being arranged between the base plate and the second rotatable plate. The base plate is preferably implemented as one of the peripheral plates of the set of plates, i.e. it is preferably adapted for contacting one of the planar members with one of its contact faces, as can be seen in FIG. 1. According to some embodiments, the base plate is adapted for being fixed to the first planar member. This may prevent accidental entrainment or coupling to the movement of any neighboring moveable plate. The fixture of the base plate may be implemented in various known ways, two non-limiting examples being mechanisms involving clamps or screws.

The base plate may further serve the purpose to fill a major part of the vertical space between the two planar members. This may be achieved by increasing or maximizing the thickness of the base plate. A high alignment position may be desirable in particular applications, which may be achieved with embodiments of the disclosure which comprise moveable plates with merely a small slope angle of the slope's contact surface compared to a plane parallel plate. As will be discussed further below, the angular alignment precision increases with decreasing slope angle of the rotatable plates. Therefore, in these usage scenarios, at least the rotational plates may be machined from thin plates, which may be a manufacturing advantage and may increase flexibility of usage by enabling the use of an identical set of rotatable plates for gaps of different sizes, while the base plate may remain the only part which is specific for a particular gap height.

The contact places of the base plate are parallel to each other in order to prevent angular biasing, which would otherwise have to be considered during installation of the lowest transmitter in a gap between two planar members and/or during determining the adjustment angles which are needed to provide a desired alignment.

According to embodiments, the set further comprises a slide plate, the load transmission path further comprising the slide plate, the slide plate comprising two flat contact faces and being shiftable along at least one of its contact faces, the contact faces of the slide plate being non-parallel to each other.

A slide plate may provide additional vertical alignment of the load transmitter, especially after completing the angular alignment of the plate stack. With its two non-parallel contact faces, shifting the slide plate along it's at least one shiftable contact face may result in a height adjustment of the set of plates. Particularly, the slide plate may be shifted such that a remaining vertical gap height between the uppermost contact face of the set of plates and the second planar member is closed, i.e. the set of plates is brought into physical contact with the second planar member, and thus, with both planar members at the same time. The slide plate may therefore provide the capability of adjusting the vertical dimension of the set of plates independently from the angular adjustment provided by the two rotatable plates. Especially after completion of the angular adjustment utilizing a method according to some embodiments of the disclosure, the height of the set of plates may be adjusted using the slide plate and without influencing the angular adjustment which may already have been achieved.

Preferably, the slide plate is the plate which is adapted for facing the second planar member, i.e. in a vertically arranged set of plates, the slide plate is preferably the uppermost plate of the set of plates. This may reduce the probability of accidentally moving one or more of the other plates of the set of plates due to frictional coupling, and thus improve the capability to adjust the height of the set of plates and the inclination angles of the set of plates relative to the second planar member independently from each other.

According to some embodiments, the second rotatable plate is arranged between the slide plate and the first rotatable plate. In additional to the shifting degree of freedom, the slide plate may also have a rotational degree of freedom around a rotational axis normal to one of its contact faces. In other words, the slide plate may be one of the rotatable plates, which may allow for designing the load transmitter, e.g. with two or three plates. A load transmitter comprising a rotatable slide plate in a two plate design would then comprise the first rotatable plate and the slide plate being identical with and adapted for acting as the second rotatable plate. A three plate design utilizing a rotatable slide plate might then comprise a base plate according to some embodiments of the disclosure, the first rotatable plate and the slide plate being identical with and adapted for acting as the second rotatable plate. However, decoupling between the degrees of freedom pertaining to vertical and/or angular alignment may be provided by constructing the set of plates with a shift only slide plate. In this case, and as discussed above, it may be advantageous to place the non-rotatable slide plate above the rotatable plates, which would, e.g. mean that the second rotatable plate is arranged between the slide plate and the first rotatable plate.

The rotatable plates, being adapted for providing angular alignment of the load transmitter, and the slide plate according to embodiments of the disclosure, providing additional vertical alignments for the load transmitter, may be considered sufficient in the sense of adjusting a sufficiently large number of degrees of freedom of the set of plates in order for utilizing it to act as an adjustable load transmitter. Each degree of freedom of the set of plates may be assigned to a plate comprised by the set of plates for adjusting this degree of freedom, and the entirety of plates adjusting a degree of freedom of the set of plates is referred to as 'moveable plates' herein. The top set of moveable plates in the set of plates may be complimented by other, non-moveable plates, which are not adapted for adjusting a degree of freedom of the set of plates. The base plate, as described before and according to some embodiments, is one example, without limitation, of a non-moveable plate. The rotatable plates and the slide plate, as also described above and according to embodiments of the disclosure, are examples, also without limitation, of moveable plates.

According to embodiments, the load transmitter further comprises a bolt, each of the plates comprising a hole, the bolt being received by the holes, at least one of the plates being floatingly supported by the bolt. According to some embodiments, the load transmitter further comprises a bolt, each of the plates comprise a hole, the bolt is received by the holes, an end of the bolt comprises an external thread, the hole of the base plate comprises an internal thread, the internal thread is adapted for receiving the external thread, the plates apart from the base plate are floatingly supported by the bolt, and the method further comprises interlocking the plates by tightening the bolt.

Inserting a bolt through the set of plates may provide additional mechanical stability, e.g. by preventing the plates from slipping off from each other. The holes through the plates are manufactured with clearance relative to the bolts such that the presence of the bolt does not hamper the motion of the moveable plates, e.g. during angular and/or vertical adjustment. The arrangement of plates surrounding the bolt with a clearance is referred to as a 'floating support' of the plates by the bolt.

The bolt may act as a guide pin for the plates comprised by the set of plates. This function may be enhanced, i.e. the number of degrees of freedom of the set of plates with respect to the bolt may be further restricted, by providing the bolt with a screw head. The screw head may provide the further advantage of facilitating a tightening of the bolt if at least part of the bolt and a counterpart surface of the holes is provided with a matching pair of threads.

For one of the plates, the hole may be a blind hole, which may prevent an end of the bolt from escaping the set of plates. For the case that the set of plates is a vertical arrangement of plates, the blind hole is preferably comprised by the bottom plate of the set of plates. In embodiments comprising a base plate, the blind hole is preferably comprised by the base plate. The blind hole may comprise an internal thread, and the blind hole and the internal thread may be adapted for receiving a threaded section of the bolt.

According to some embodiments, the base plate comprises a hole, an end of the bolt comprising an external thread, the hole of the base plate comprising an internal thread, the internal thread being adapted for receiving the external thread, the load transmitter being adapted for interlocking the plates by tightening the bolt. This arrangement may be beneficially used for tightening the bolt against the set of plates, which may prevent the plates from slipping off from each other due to the strong static friction thus introduced to the set of plates at the respective contact faces interfacing each other. The static friction may be strong enough that slipping is effectively prevented even if the full load between the two planar members is applied to the load transmitter. In this way, the high adjustment precision which may be provided by the moveable plates may be maintained during load application.

According to some embodiments, the slide plate comprises a hole and being floatingly supported by the bolt, the hole of the slide plate being a slot hole.

Providing the slide plate with a slot hole may extend its working range, i.e. the range of vertical positions which can be adjusted using the slide plate, in embodiments where the bolt is used to inhibit lateral movement of the plate. As this restriction may counteract the purpose of the slide plate, the desired function of the slide plate may be restored by providing it with the slot hole, which is preferably oriented in a shifting direction of the slide plate. An example shifting direction of the slide plate is the direction of steepest slope, or largest gradient, of the two contact faces relative to each other. The example shifting direction thus defined is also applicable for embodiments of the load transmitter which do not include the bolt.

A further advantage of the bolt may be that it provides for a common rotational axis of the set of plates. This may increase reproducibility and precision of angular adjustments.

According to some embodiments, at least two of the plates are adapted for adhering to each other via magnetic forces. According to some embodiments, the method further comprises adhering at least two of the plates to each other via magnetic forces.

This may provide an additional safeguard for preventing the plates from slipping off each other. Such adhesion may be achieved by providing at least two of the plates, and/or one or more elements, regions, sections, portions, and/or areas etc., of the plates from or with the material (e.g. a ferromagnetic metal such as iron) which is magnetizable and/or susceptible to magnetization by an external magnetic field. The magnetic and/or magnetizable plates may be located at various positions in the set of plates, for instance, in a four plate design, the two inner plates may comprise a permanent source of a magnetic field, while the two outer plates may comprise no such source, but being magnetizable. Another example can use the same configuration as described, but the non-permanent magnetic plates being unsusceptible to a magnetic field. Another example can use the opposite configuration with the magnetic properties of the inner and outer plates interchanged. Another example can use an alternating sequence of a permanent magnetic plate, followed by a non-permanent magnetic or magnetically unsusceptible plate, followed by a permanent magnetic plate, followed by a non-permanent magnetic or magnetically unsusceptible plate. Another example can use a setup comprising three permanent magnetic plates, and/or a setup where all four plates comprised by the set of plates are permanent magnetic or comprise permanent magnetic elements or areas. Analogous considerations apply to embodiments comprising a different number of plates. Permanent magnetization of a plate or an area or element of a plate may be provided by magnetization of the bulk of the plate or its respective magnetized area, or by providing one or more of the magnetic plates with one or more magnetic elements, such as a discreet permanent magnet, which may be in permanent physical connection with the plate or embedded into the bulk of the magnetic plates, a cavity of the magnetic plates, or the like.

Before turning to the methods according to embodiments of the disclosure for adjusting an alignment between two planar members, the functionality of the load transmitters is discussed in greater detail in the following, with references being made to the Figs. as appropriate.

Figure 2:
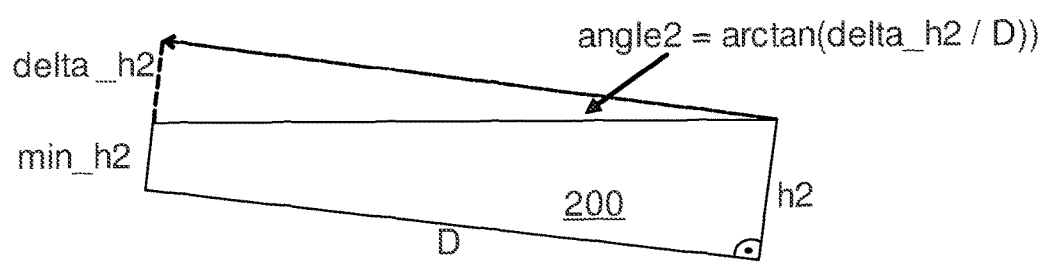
FIG. 2 is a schematic cut through a right trapezoidal plate according to some embodiments of the present disclosure.

An example design for the moveable plates is that of a cylindrical segment, and more preferably, a cylindrical segment where one out of the two cutting planes defining the cylindrical segment is perpendicular to the axis of the cylinder and the other cutting plane is tilted with respect to the cylinder axis. In a schematic cut view of a plane, e.g. oriented parallel to the gradient of the two tilted cutting planes and comprising the primary axis of the cylindrical segment, the cylindrical segment appears as a right trapezoid comprising two right angles on the straightly cut side and two non-right angles on the obliquely cut side, as is shown in FIG. 2. The cylinder sectional plate 200 shown in FIG. 2 can be divided into a straight cylindrical section of diameter D and height $h_{min,2}$ (also referred to as min_h2 in FIG. 2), and a cylindrical wedge of diameter D and height $\Delta_{h2}$ (also referred to as delta_h2 in FIG. 2). The straight cylindrical section has a rectangular cross-section, and the cylindrical wedge has a right triangular cross-section. The largest height, or total height h2, of the cylindrical segments plate is the sum of its rectangular height $h_{min,2}$ and its triangular height $\Delta_{h2}$ measured in a central gradient plane of the plate. The steepness of the slope provided by the cylindrical segment plate is defined by its slope angle, denoted $\beta_2$ (also referred to as angle2 in FIG. 2). In FIG. 2, which is measured in the central gradient plane as defined before and is representative of the ratio between the largest height difference $\Delta_{h2}$ adjustable by moving the plate, and its diameter D, through the relation $\beta 2 = \arctan(\Delta_{h2}/D)$. The equivalent triangle defining this relation is indicated with two dashed lines in FIG. 2.

FIG. 2 illustrates the definition of a 'thin plate' as used herein. A thin plate may be a plate with its total height h2 being small (e.g. by an order of magnitude, or a factor of 10 or more) compared to its diameter D. A thin plate may have the advantage of providing a small slope angle, which may analogously be defined using the relationship above with the additional requirement that $\Delta_{h2}$ be small, in the same sense as above, compared to the plate diameter D. A plate with a small slope angle may result in a high adjustment precision of the stack of plates relative to the two planar members.

Figure 3:
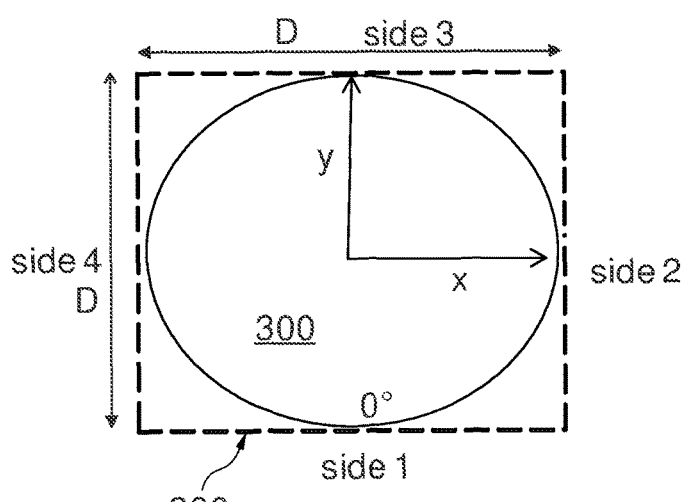
FIG. 3 is a top view of a plate with an inclined surface according to some embodiments of the present disclosure.

FIG. 3 illustrates a top view of the plate 200 which is shown in a central gradient cut in FIG. 2. The upper contact surface 300 of the plate 200 is drawn with a slightly elliptical shape to illustrate that this surface is tilted against a perpendicular cylindrical cut. An adjustment angle of 0° is indicated on the surface, and four sides of the plate corresponding to adjustment angle positions of 0°, 90°, 180°, and 270° are labeled as side 1 through side 4, respectively. Furthermore, a coordinate system centered at the primary cylindrical axis is overlaid on contact face 300, the x-axis connecting sides 2 and 4 and the y-axis connecting sides 1 and 3, with sides 2 and 3 corresponding to the respective positive hemispheres. Side 2 corresponds to the right hand side in FIG. 2, and side 4 corresponds to the left hand side in FIG. 2. The labels, adjustment angles, and coordinates as well as the relationships between them defined by FIG. 3 will be used in the remaining descriptions of this disclosure.

Figure 4:
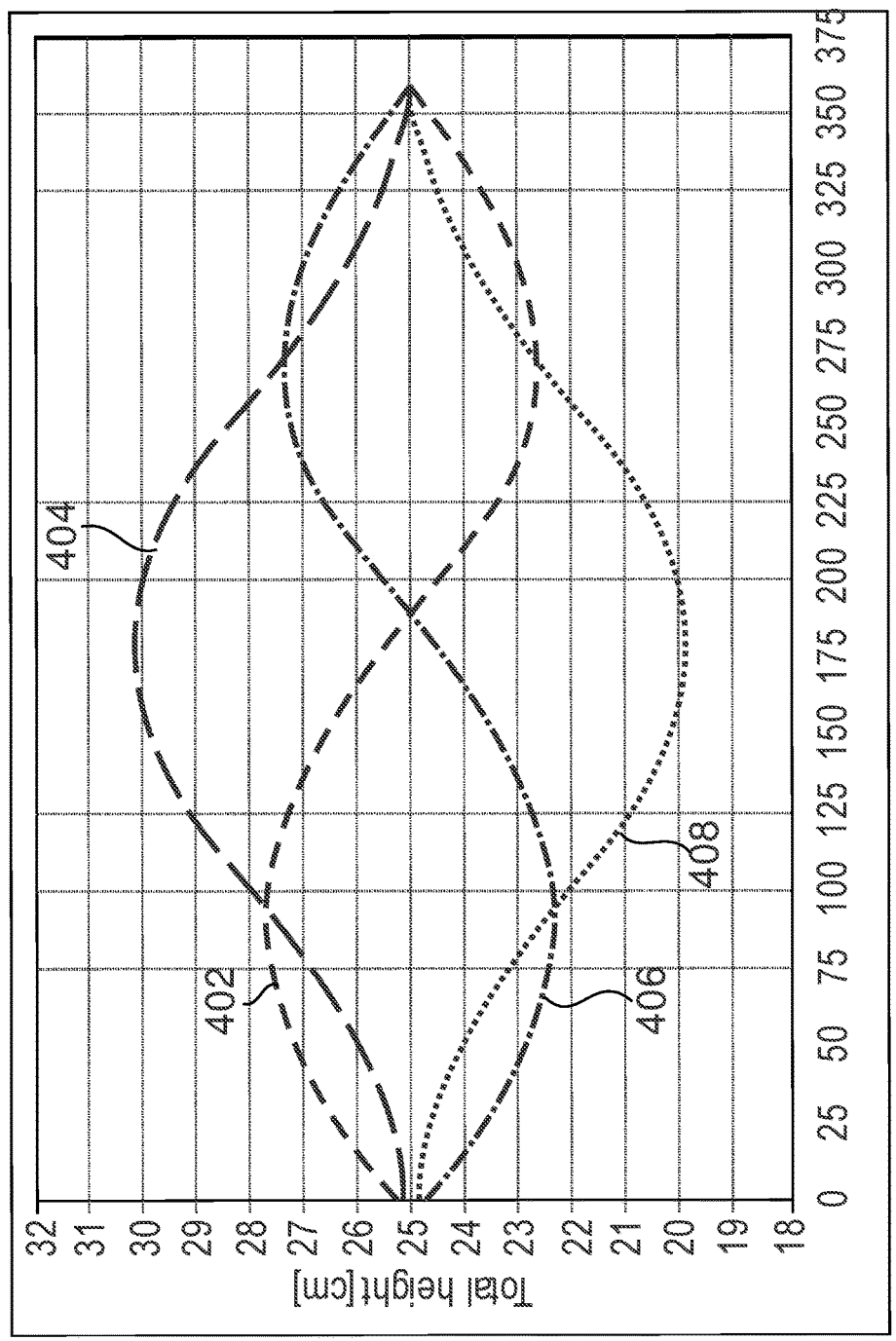
FIG. 4 is a diagram illustrating the movement of four points on the inclined surface upon rotation of one plate according to some embodiments of the present disclosure.

For the four sides of the plate shown in FIGS. 2 and 3, the respective changes in vertical position in response to adjusting the adjustment angle ω of the plate. The movement of side 1, side 2, side 3 and side 4 is represented by curve 402, 404, 406, and 408, respectively in FIG. 4. FIG. 4 illustrates the changes of vertical positions for these four sides for the scenario that the plate is installed in a set of plates which is pre-set to a configuration where the upper contact face 300 is in a horizontal orientation at adjustment angle ω=0°. The simulation is based on the assumption that the given plate is supported by another cylinder sectional plate, the contact face of which being tilted against horizontality. As a consequence, the upper contact face 300 of the given rotatable plate 200 leaves its horizontal configuration if the adjustment angle ω is changed. At ω=0°, the total height of the set of plates is simulated to be 25 cm. The four curves corresponding to the respective sides of the given plate have sinusoidal shapes with different faces and height offset. Curve 402, representing the vertical position of side 1, is a positive sine with an amplitude of 2.5 cm and an offset of 25 cm. Side 2 is represented by curve 404, which is a negative cosine of the same amplitude and with an offset of 27.5 cm. Curve 406 depicts the vertical position of side 3 by a negative sine of the same amplitude and with offset 25 cm. Eventually, curve 408 represents the change in position of side 4, which is a positive cosine of the same amplitude and with offset 22.5 cm. The four curves shown in FIG. 4 correspond to a plate configuration where both plates have an adjustable height difference $\Delta_h$ of 2.5 cm. As sides 2 and 4 correspond to the highest and lowest points on contact face 300, respectively, the two adjustable heights sum up to a vertical displacement of +5 cm at ω=180° for side 2, and −5 cm for the lowest point represented by side 4 at the same adjustment angle. Sides 1 and 3 are located at rotationally neutral positions of the given plate and therefore show only the vertical variation of the total height at the respective side caused by the slope of the supporting plate not shown in FIGS. 2 and 3. The simulation is based on the further assumption that the lower contact face of the supporting plate is in a horizontal configuration.

Figure 5A:
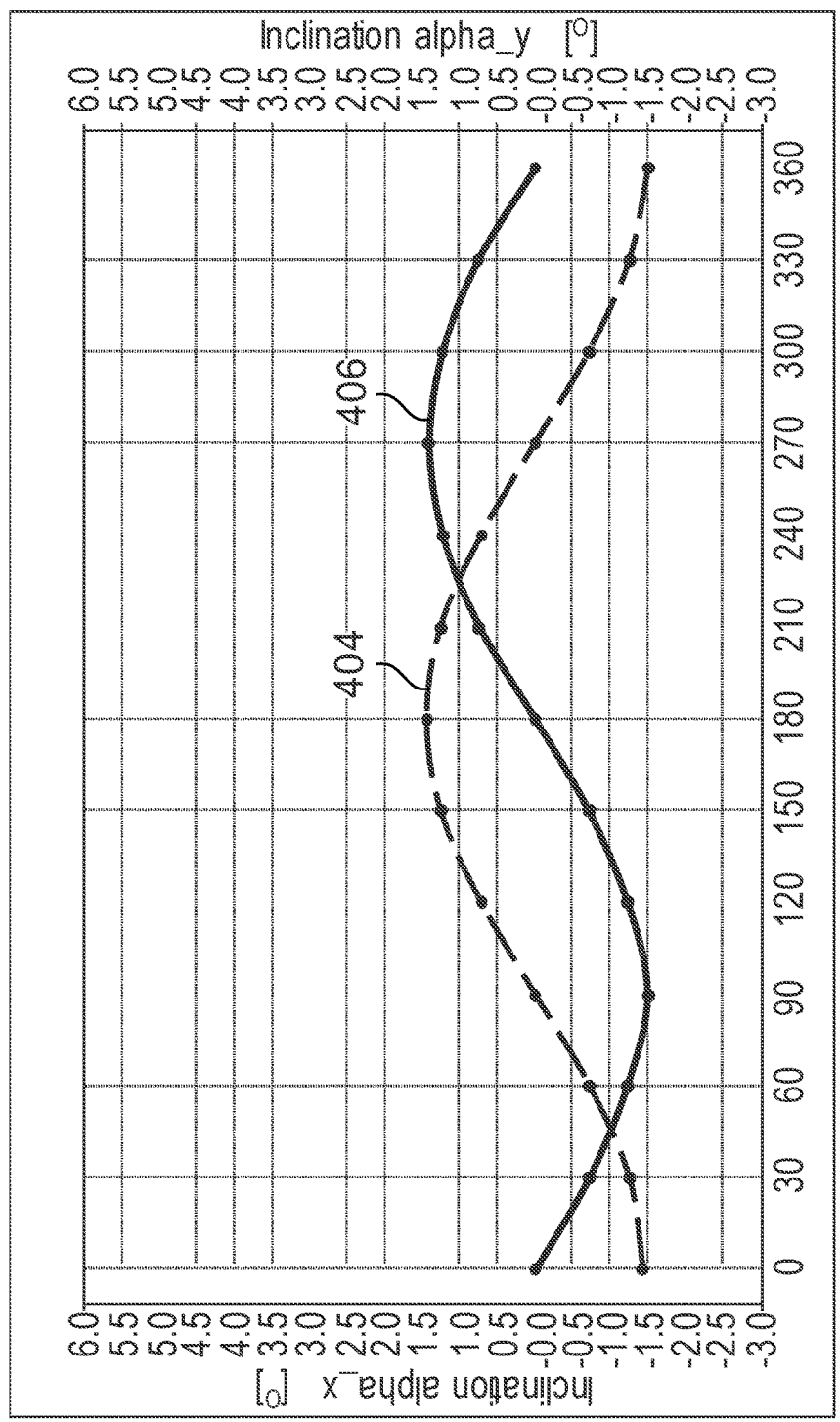
FIG. 5A is a diagram illustrating the change of two perpendicular inclination angles upon rotation of one plate according to some embodiments of the present disclosure.

FIG. 5A shows a diagram where the movement of side 2 and side 3 is represented in terms of the inclination angle α measured between the upper contact face 300 of the given plate 200 and a hypothetical horizontal plane. Different from FIG. 4, the simulation of FIG. 5A is based on the assumption that the lower contact face of the given plate 200 is a horizontal configuration. Curve 404 depicts the change of the inclination angle $\alpha_x$ measured in positive x-direction (side 2), and curve 406 shows the change in the inclination angle $\alpha_y$ measured in positive y-direction (side 3) as defined by the coordinate system shown in FIG. 3. The angle curves of FIG. 5A are equivalent to the height curves 404 and 406, respectively, shown in FIG. 4, i.e. they differ from the respective curves of FIG. 4 only in their amplitude and their ordinate offset, but not in their phase with respect to the adjustment angle ω. For the adjustment angle ω=0°, side 2 is inclined towards horizontality, which corresponds to an inclination angle of $\alpha_x$=1.432°, while the rotationally neutral side 3 has an initial inclination of 0.0°. As the adjustment angle increases towards ω=180°, side 2 equals out at 90° and turns away from horizontality at 180° with an inclination angle of +1.432°. In the same manner, side 3 opens from horizontality towards its minimum inclination angle of $\alpha_y$=−1.432° at ω=90°, and then rising again towards its maximum inclination angle of identical value, but with positive sine, reached at ω=270°. The face difference between sides 2 and 3 of 90° is reflected in the same face difference between curves 404 and 406. For the given plate of FIGS. 2-4 with an adjustable height of 2.5 cm, the inclination angles correspond to a plate with diameter D=100 cm.

Figure 5B:
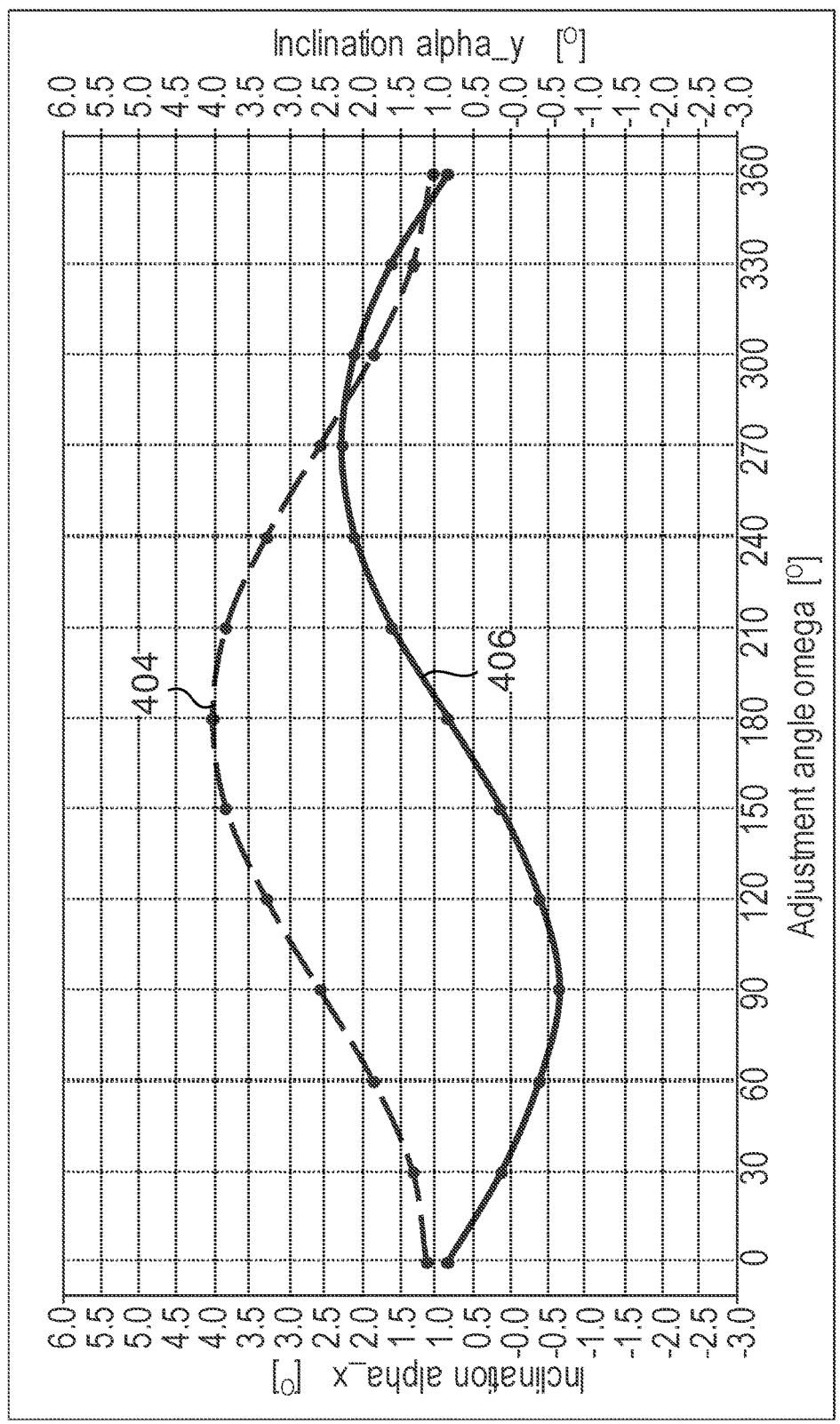
FIG. 5B is a diagram illustrating the change of two perpendicular inclination angles upon rotation of one plate in a different plate configuration according to some embodiments of the present disclosure.

FIG. 5B shows a diagram with the inclination angles $\alpha_x$ and $\alpha_y$ reached by the given plate, with the difference that the lower contact face of the given plate is now supported by a rotational plate which is turned away from the horizontal configuration of FIG. 5A by an adjustment angle ω=217°.

The change in rotational configuration introduced different offsets to the two inclination angles, namely an increase of 2.6° on inclination angle $\alpha_x$ (represented by curve 404), and an increase of 0.9° for inclination angle $\alpha_y$ (represented by curve 406). Comparison of FIGS. 5A and 5B shows that the adjustment of the supporting plate had no effect on the amplitude and phase of the two curves.

The operational principle of the adjustable load transmitter according to embodiments of the disclosure can be demonstrated with an example involving FIGS. 5A and 5B. According to the example, the rotatable plates of the adjustable load transmitter are to be adjusted to unknown adjustment angles such that the set of plates assumes the required inclination angles of $\alpha_x=+1.2°$ and $\alpha_y=+0.9°$. It can be seen from FIG. 5A that there is no adjustment angle to where $\alpha_x$ can be adjusted to +1.2° and, at the same time, inclination angle $\alpha_y$ has the desired value of +0.9°. Instead, at the two adjustment angles of approximately 150° and 210° where $\alpha_x$ reaches a value of +1.2°, $\alpha_y$ assumes the values of approximately −0.7° and +0.7°, respectively. However, by turning the supporting plate to the appropriate adjustment angle of to =217°, the two curves could be shifted upward by two different inclination offsets, and as a result, the desired inclination angles are coincidentally assumed at the adjustment angle to =0°. In general, a desired inclination angle within the adjustable ranges for $\alpha_x$ and $\alpha_y$ for a given set of plates may get adjusted by turning each of the rotatable plates about an appropriate adjustment angle, which may be non-zero.

The adjustable range of inclination angles and height differences which can be provided by a given set of plates depends on the dimensions selected for each of the plates in the set. Therefore, the set of plates needs to be dimensioned for a specific or typical environment or usage scenario where the adjustable load transmitter is to be deployed.

According to some embodiments, the method further comprises dimensioning each of the plates such that the thickness of the set of plates is adjustable to match the clearance by rotating the rotatable plates. According to some embodiments, the method further comprises measuring the inclination angles and measuring a length of the clearance. According to some embodiments, the method further comprises using the inclination angles and the dimensions for dimensioning each of the plates such that the thickness of the set of plates is adjustable to match the clearance. The dimensions may comprise, for a given plate, a diameter D, a height offset $h_{min}$, an adjustable height difference $\Delta_h$, a total height h, and/or a slope angle $\beta$ as described above. Advantages of dimensioning the set of plates and/or measuring the inclination angles and a length (i.e., in vertical implementation conditions, a height) of the clearance are illustrated by way of the example given in FIG. 6.

Figure 6:
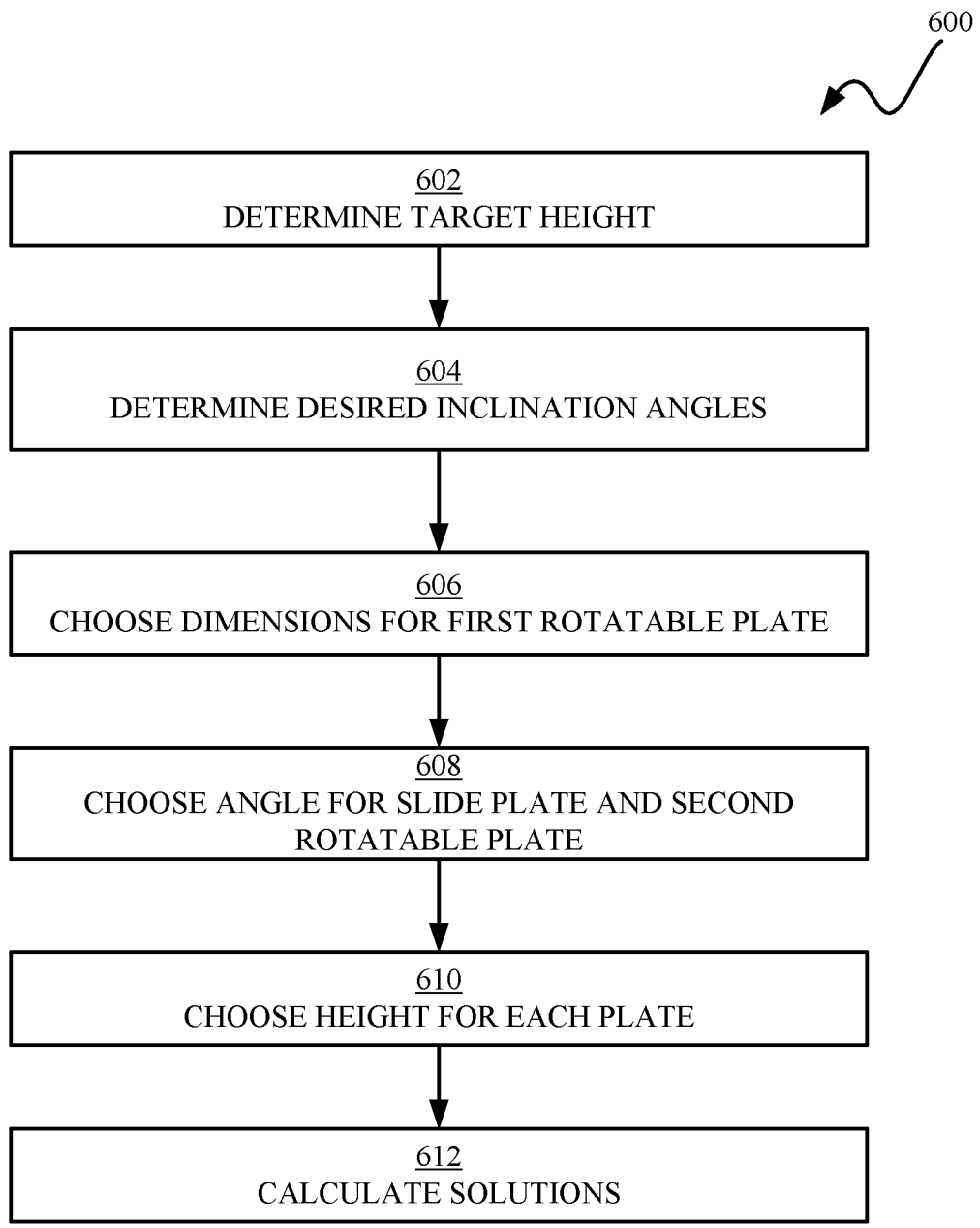
FIG. 6 is a flow diagram illustrating a method for dimensioning a set of plates according to some embodiments of the present disclosure.

FIG. 6 shows a flow diagram for an exemplary method 600 for dimensioning a set of plates according to embodiments of the disclosure. The set of plates in this example comprises a plane parallel base plate, the two rotatable plates supported by the base plate, and a slide plate supported by the second rotatable plate. Although the given example merely refers to a setup with four plates, dimensioning methods 600 may be applied analogously to implementations using a different number of plates, e.g. by repeating a step for a plate of a given type if the particular setup comprises an additional plate of that given type, or by skipping a step for a plate of a given type if the given setup does not comprise a plate of that given type. In the example of FIG. 6, the slide plate is labeled 1, the upper or second rotational plate supporting the slide plate is labeled 2, and the first or lower rotatable plate supporting the first rotatable plate is labeled 3.

At block 602, the target height H is determined which needs to be achieved by the set of plates. The target height H is usually the height of the gap between the two planar members. At block 604, the inclination angles to be adjusted are determined. In the example of FIG. 6, the two different inclination angles are observed in the x and y directions; however, the inclination angles may be observed in two different arbitrary, non-parallel directions. The dimensioning of the plates is then chosen such that the inclination angles to be adjusted are within the adjustable range of inclination angles, which is usually between 0 and the sum of slope angles $\beta$ of all rotational plates in the set.

At block 606, the slope angle of plate 3 (the lower rotatable plate) is determined first, as this slope angle $\beta_3$ defines the largest angular offset which can be added to the adjustable range of the second rotatable plate by setting the adjusted angle of plate 3, as can be seen from the diagrams of FIGS. 5A and 5B. For a given plate diameter D, which is selected to fit the environment where the adjustable load transmitter is to be deployed, the adjustable height difference $\Delta_{h3}$ is then selected according to this requirement to yield the slope angle $\beta_3=\arctan(\Delta_{h3}/D)$, as can be seen from FIG. 2. The remaining height offset of plate 3, $h_{min,3}$, may then be rounded to the next practical value for manufacturing.

At block 608, the slope angled $\beta_1$ for the slide plate and $\beta_2$ for the second rotatable plate are chosen. It may be a good choice to select an identical slope angle $\beta_2$ to the one chosen for the first rotatable plate in order to align both inclination angles under equivalent conditions. For instance, two rotatable plates with an identical slope angle may introduce identical uncertainties to the adjusted pair of inclination angles. On the other hand, it may be beneficial to manufacture both rotatable plates with different slope angles, e.g. the first rotatable plate with a larger slope angle $\beta_1$ and the second rotatable plate with a substantially smaller slope angle $\beta_2$. In this case, the rotatable plate with the larger slope angle may be used for course adjustment, while the final fine adjustment may be performed using the rotatable plate with the smaller slope angle. This is, however, at the cost of introducing larger uncertainties to the adjusted inclination angles $\alpha_1$ and $\alpha_2$ as the uncertainty of the inclination angles may be a function which grows proportional to a growing slope angle. Uncertainty is a criterion which may be taken into account during dimensioning in general.

Similar considerations as to angular adjustments apply also to the capability of vertical adjustment provided by the slide plate. If the rotatable plates have been chosen with identical slope angles $\beta$, the rule of thumb $\beta_1 \geq 2 \beta_3$ is suggested to allow for compensating the largest inclination angle which is adjustable by setting the adjustment angles of the rotatable plates. This rule of thumb is, however, not a general rule and the slope angle $\beta_1$ may be approximated, simulated, or calculated in a different way which may be more suitable for a given scenario of use.

At block 610, after all slope angles have been defined, the heights are chosen for the different plates, this time including the base plate. For each plate being not plane parallel, this means to select the remaining height offset $h_{min}$, which corresponds to the height of the rectangular part of the cross-section shown in FIG. 2 and sums up to the total plate height $h=h_{min}+\Delta_h$. For the base plate, this means to select a suitable thickness of a plate from which the base plate is to be manufactured. It may be advantageous, e.g. in order to achieve a more homogeneous waste distribution or to manufacture all plates from the same raw plate, to select an identical value for all total heights h. However, it may also be desirable to distribute the largest part of height difference to the base plate and manufacture the sloped plates as thin and/or light as possible. This may increase flexibility, e.g. by using a thick standard set of sloped plates for several usage scenarios involving pairs of planar members with different gap sizes, and/or minimizing the weight of the moveable plates in order to reduce slipping probability.

As another rule of thumb, the rotatable plates may be chosen with equal total heights h, calculated by $(H-h_4)/3$, where H is the target height (e.g. the height of the gap), and h4 is the height of the flat plate labeled with 4. Some tolerance or guard bands may be added for convenience. Furthermore, more than one flat plate may be used, e.g. in a modular system, to construct a most suitable combination of flat plates for distributing the gap height into a flat offset section provided by the set of flat plates, and the sloped and/or moveable plates with heights as possibly required otherwise.

At block 612, dimensioning of the set of plates is complete, and a method according to some embodiments of the disclosure may be performed for calculating solutions, i.e. adjustment angles and, optionally, a remaining height difference to be closed by moving the slide plate, for adjusting the moveable plates of an adjustable load transmitter to be manufactured from the previously dimensioned plates to an appropriate set of inclination angles and, optionally, a slide plate position which is expected to provide an alignment according to a particular requirement of inclination angles and target height.

In the following, methods according to embodiments of the disclosure, the methods utilizing the adjustable load transmitter according to embodiments of the disclosure, are discussed with reference to the Figures.

The disclosed method may advantageously provide and utilize the adjustable load transmitter for adjusting an alignment between a first planar member and a second planar member separated from each other by a gap. In particular, the method uses the two rotatable plates to provide angular adjustment between the two planar members by rotating each of the rotatable plates about a pre-determined adjustment angle around its respective rotational axis. The plates are then adjusted further to close a clearance between the second planar member and the contact face of the set of plates facing the second planar member. This way, the method provides for establishing a load transmission path between the planar members. A main advantage may be a beneficial combination of high-precision adjustment and load transmission capability through a load transmission path with a large cross-sectional area.

According to some embodiments, the set further comprises a base plate, the load transmission path further comprises the base plate, the base plate comprises two flat contact faces, the contact faces of the base plate are parallel to each other, and the providing comprises installing the base plate between the first planar member and the first rotatable plate. The base plate may serve as a sliding surface for the first rotatable plate. This may have the advantage of reducing abrasion of the first planar member and the first rotatable plate.

Figure 7A:
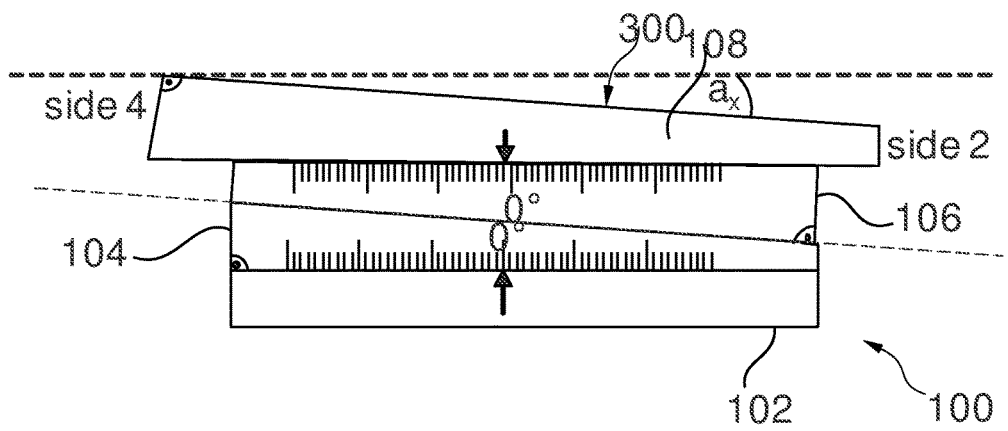
FIG. 7A is a schematic cut through a representative set of plates before rotation according to some embodiments of the present disclosure.
Figure 7B:
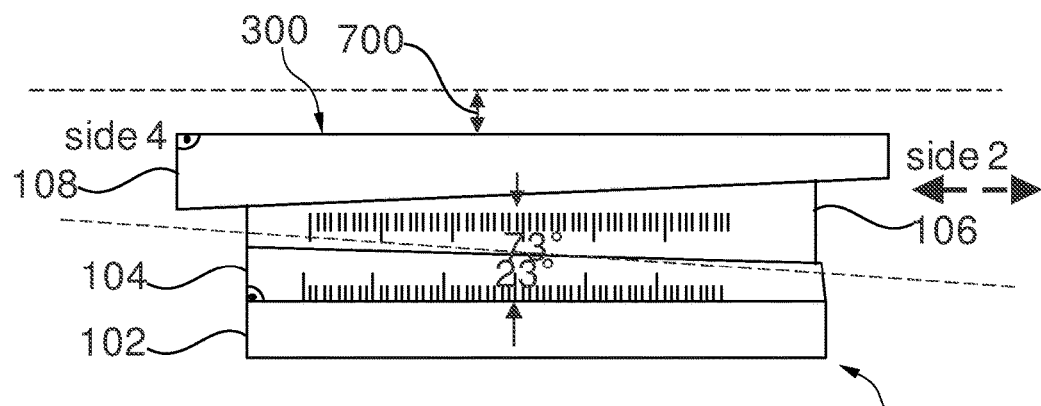
FIG. 7B is a schematic cut through a representative set of plates after rotation according to some embodiments of the present disclosure.
Figure 7C:
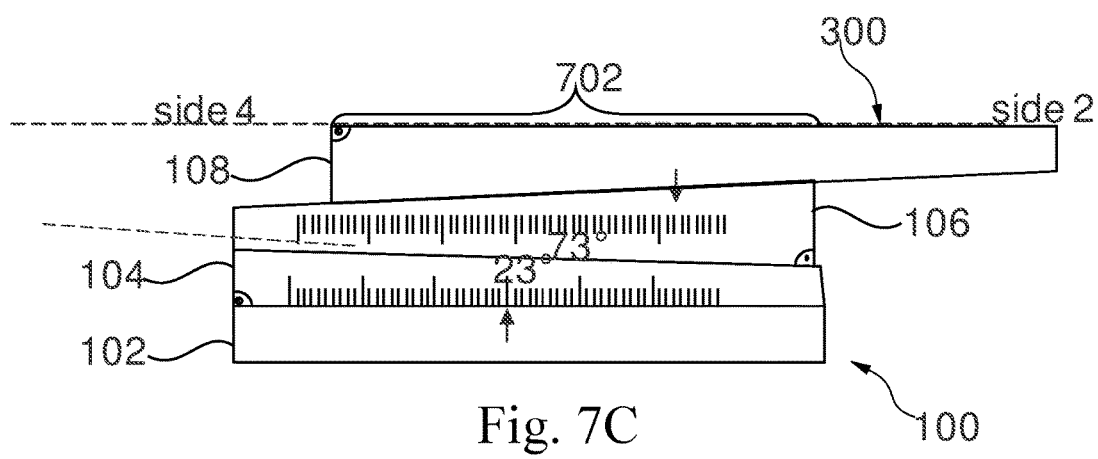
FIG. 7C is a schematic cut through a representative set of plates after rotating and shifting according to some embodiments of the present disclosure.

FIG. 7A through 7C schematically illustrate the method for a non-limiting example of an adjustable load transmitter according to some embodiments of the disclosure in which the set of plates 100 comprises four plates, namely a plane-parallel base plate 102 supporting the first rotatable plate 104, the first rotatable plate 104 cut straight on one side and slanted on the other side and supporting the second rotatable plate 106, the second rotatable plate 106 cut straight on one side and slanted on the other side and supporting a slide plate 108 cut straight on one side and slanted on the other side. The base plate 102 and the rotatable plates 104, 106 are of equal diameter, while the diameter of the slide plate 108 is slightly larger. The rotatable plates 104, 106 are provided each with an angular scale and the base plate 102 and the slide plate 108 are provided each with a tick mark in a central position.

In FIG. 7A, the rotatable plates 104, 106 are configured in starting positions, defined as the slide plate 108 being shifted such that its tick mark is aligned with the tick mark of the base plate 102, and the rotatable plates 104, 106 being adjusted by an adjustment angle of $\omega=0°$ with respect to the respective tick mark. The cut shown in FIGS. 7A-7C is oriented in x direction (connecting sides 2 and 4 as defined in FIG. 3). A required orientation of the second planar member in the x-direction is indicated by a dashed line connecting with the top point of the set of plates 100 in the x-z plane. The upper side of the set of plates 100, i.e. the contact face 300 of the slide plate 108 adapted for facing the second planar member, is tilted against horizontality about the inclination angle $\alpha_x$ in x direction. The initial orientation of the interface between the two rotatable plates 104, 106 in x direction is indicated by a coarsely dashed line.

In FIG. 7B, the first rotatable plate 104 is now adjusted to adjustment angle $\omega_3=32°$ and the second rotatable plate 106 is adjusted to adjustment angle $\omega_2=73°$. The change in adjustment is also visible by comparison to the coarsely dashed line, which is copied from FIG. 7A. This adjustment was found in this example to result in parallel alignment of contact face 300 to the required alignment in x direction (dashed line). In this example, the angular alignment of contact face 300 is assumed to be also parallel to the required alignment in y direction (not shown). The angular alignment leaves a vertical clearance 700 between contact face 300 and the dashed line representing the required x orientation of the second planar member. In this example, the clearance 700 is also assumed to be parallel to the required alignment in y direction (not shown).

According to some embodiments, the set further comprises a slide plate, the load transmission path further comprises the slide plate, the slide plate comprises two flat contact faces and is shiftable along at least one of its contact faces, the contact faces of the slide plate are non-parallel to each other, the providing comprises installing the slide plate between the second planar member and the second rotatable plate, and the establishing comprises shifting the slide plate until one of its contact faces comes into contact with the second planar member. As indicated by the example given in FIG. 7C, this may yield the advantage of providing vertical adjustment without interfering with the angular adjustment achieved by adjusting the rotatable plates.

In FIG. 7C, the slide plate is shifted towards the right-hand side, such that the clearance 700 is closed. In this example, the clearance 700 is also assumed to be closed in y direction (not shown) as the angular alignment achieved by the adjustments of the rotatable plates 104, 106 is also parallel to the required alignment in the y direction. The shift of slide plate 108 results in a parallel transformation of contact face 300 towards the dashed line without changing the angular alignment achieved by the previous adjustment of the rotatable plates 104, 106. The shift of the slide plate 108 completes the discussed adjustments, and as a result, the load transmission path 702 is formed by the intersection of the cross sections of the plates 102, 104, 106, 108 in the adjusted configuration shown in FIG. 7C.

According to some embodiments, the method further comprises determining the adjustment angle for each of the rotatable plates based on the inclination angles and on the dimensions of the plates. This may be performed, for instance, by calculating and/or simulating the alignment angles which are realized for each setting (or, alternatively, a particular setting) of the adjustment angles w. As an advantage, the unknown alignment angles ω needed to bring the adjustable load transmitter into a specific required adjustment may be obtained.

Figure 8:
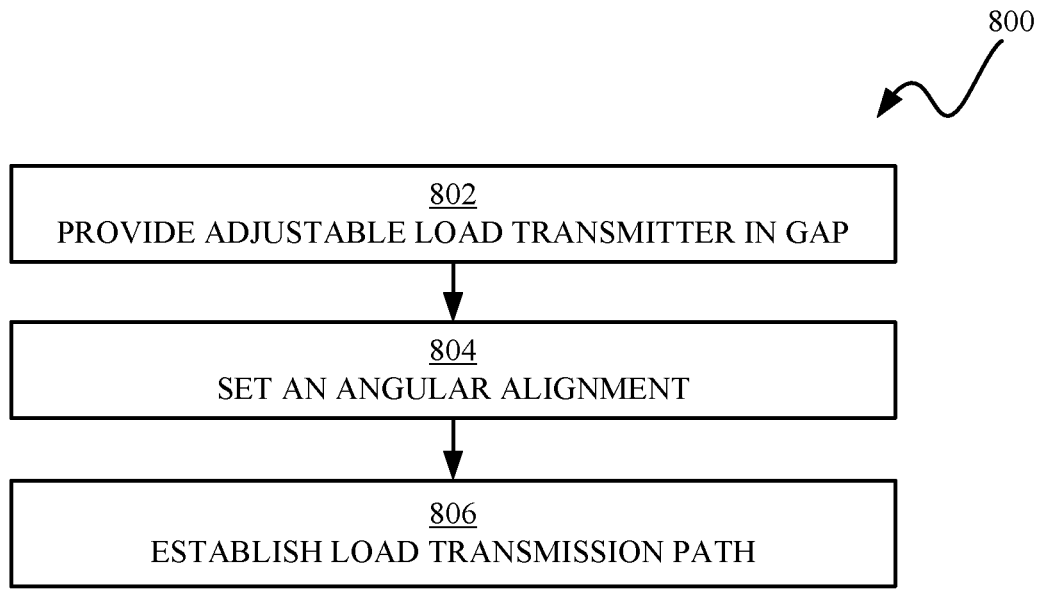
FIG. 8 is a flow diagram illustrating a method for adjusting an alignment according to some embodiments of the present disclosure.

FIG. 8 is a flowchart illustrating a method 800 for adjusting an alignment between a first planar member and a second planar member where the planar members are separated from each other by a gap.

Operation 802 can provide an adjustable load transmitter in the gap. The load transmitter can comprise a set of plates adapted to be received inside the gap. The set can comprise a first rotatable plate and a second rotatable plate. The set can be adapted for transmitting a load via a load transmission path between the planar members. The load transmission path can comprise the first rotatable plate and the second rotatable plate. Each of the plates can comprise two flat contact faces. The contact faces of the first rotatable plate can be non-parallel to each other, and the contact faces of the second rotatable plate can be non-parallel to each other. One of the contact faces of the first rotatable plate can be in permanent surface contact with one of the contact faces of the second rotatable plate. Each of the first rotatable plate and the second rotatable plate can be adapted for being rotated relative to each other around one of their respective normal axes.

Operation 804 can set an angular alignment between the second planar member and the contact face of the set of plates facing the second planar member by rotating each of the rotatable plates about a pre-determined adjustment angle around its respective rotational axis. The adjustment angles can be determined such that two angles of inclination, defined in different non-parallel directions between the second planar member and the contact face of the set of plates facing the second planar member, assume each a pre-determined value.

Operation 806 can establish the load transmission path by closing a clearance between the second planar member and the contact face of the set of plates facing the second planar member.

What is claimed is:

1. A method for adjusting an alignment between a first planar member and a second planar member, the planar members being separated from each other by a gap, the method comprising:
  providing an adjustable load transmitter in the gap, the adjustable load transmitter comprising a set of plates adapted to be received inside the gap, at least one plate of the set of plates comprising iron, at least one plate of the set of plates containing an embedded magnet, wherein at least two plates of the set of plates are adhered to one another via magnetic forces, the set of plates comprising a base plate, a first rotatable plate, a second rotatable plate, and a slide plate, the set of plates being adapted for transmitting a load via a load transmission path between the first planar member and the second planar member, the load transmission path comprising the base plate, the first rotatable plate, the second rotatable plate, and the slide plate;
  wherein each of the rotatable plates comprises a cylindrical plate having a right trapezoidal cross section, each of the rotatable plates comprising two flat contact faces, the contact faces of the first rotatable plate being non-parallel to each other, the contact faces of the second rotatable plate being non-parallel to each other, one of the contact faces of the first rotatable plate being in permanent surface contact with one of the contact faces of the second rotatable plate, each of the first rotatable plate and the second rotatable plate being adapted for being rotated relative to each other around one of their respective normal axes;
  wherein the base plate comprises two flat contact faces, the contact faces of the base plate being parallel to each other, wherein the base plate is installed between the first planar member and the first rotatable plate;
  wherein the slide plate comprises two flat contact faces, the contact faces of the slide plate being non-parallel to each other, wherein the slide plate is shiftable along a shifting direction of at least one of its contact faces, wherein the shifting direction comprises a direction of steepest slope between the two flat contact faces of the slide plate, wherein the slide plate is an uppermost plate of the set of plates, wherein the slide plate is shifted such that one of its contact faces is in contact with the second planar member and at least one of its contact faces is in contact with the second rotatable plate;
  wherein the adjustable load transmitter further comprises a bolt, an end of the bolt comprising an external thread, a hole of the base plate comprising an internal thread, the internal thread of the base plate being adapted for receiving the external thread of the bolt, the first rotatable plate and the second rotatable plate each comprising a hole receiving a portion of the bolt, each of the first rotatable plate and the second rotatable plate being floatingly supported by the bolt, wherein the slide plate comprises a slot hole oriented in the shifting direction and receiving a portion of the bolt, wherein the bolt is configured to interlock the set of plates by tightening the bolt;
  wherein providing the adjustable load transmitter further comprises:
    measuring inclination angles and measuring a length of the clearance between the second planar member and the contact face of the set of plates facing the second planar member;
    dimensioning the set of plates to satisfy, based on expected maximum values for inclination angles, a largest adjustable height difference for plates with non-parallel contact faces;
    dimensioning the set of plates to satisfy, based on dimensions of the gap, a diameter and a base thickness for each plate of the set of plates;
    using the inclination angles and the dimensions of the plates for dimensioning each of the plates such that a thickness of the set of plates is adjustable to match the clearance; and
    fixing the base plate to the first planar member by clamping the base plate to the first planar member;
  determining the adjustment angle for each of the rotatable plates based on the inclination angles and on the dimensions of the plates;

removing an angular misalignment between the second planar member and the contact face of the set of plates facing the second planar member by rotating each of the rotatable plates about a pre-determined adjustment angle around its respective rotational axis, the pre-determined adjustment angles being determined such that two angles of inclination, defined in different non-parallel directions between the second planar member and the contact face of the set of plates facing the second planar member, are adjusted to zero; and establishing the load transmission path by shifting the slide plate in the shifting direction to close the clearance between the second planar member and the contact face of the set of plates facing the second planar member.

* * * * *